(12) United States Patent
Hashimoto et al.

(10) Patent No.: US 9,748,089 B2
(45) Date of Patent: Aug. 29, 2017

(54) METHOD FOR PRODUCING MIRROR-POLISHED WAFER

(71) Applicant: SHIN-ETSU HANDOTAI CO., LTD., Tokyo (JP)

(72) Inventors: Hiromasa Hashimoto, Nishigo-mura (JP); Yoshihiro Usami, Nishigo-mura (JP); Kazuaki Aoki, Nishigo-mura (JP); Shigeru Oba, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 14/914,209

(22) PCT Filed: Aug. 20, 2014

(86) PCT No.: PCT/JP2014/004239
§ 371 (c)(1),
(2) Date: Feb. 24, 2016

(87) PCT Pub. No.: WO2015/037188
PCT Pub. Date: Mar. 19, 2015

(65) Prior Publication Data
US 2016/0217998 A1    Jul. 28, 2016

(30) Foreign Application Priority Data
Sep. 11, 2013    (JP) ................. 2013-188172

(51) Int. Cl.
*H01L 21/02* (2006.01)
*H01L 21/66* (2006.01)
(Continued)

(52) U.S. Cl.
CPC ........ *H01L 21/02024* (2013.01); *B24B 37/08* (2013.01); *H01L 21/02008* (2013.01);
(Continued)

(58) Field of Classification Search
CPC ................. H01L 21/66; H01L 21/02
(Continued)

(56) References Cited

U.S. PATENT DOCUMENTS 6,376,335 B1 *   4/2002   Zhang ................. H01L 21/3221
                                                  257/E21.214
2001/0024877 A1 *   9/2001   Vepa ....................... B24B 7/228
                                                  438/691
(Continued)

FOREIGN PATENT DOCUMENTS

JP    H07-108455 A    4/1995
JP    H10-335276 A    12/1998
(Continued)

OTHER PUBLICATIONS

Mar. 15, 2016 International Preliminary Report on Patentability issued in International Patent Application No. PCT/JP2014/004239.
(Continued)

*Primary Examiner* — Asok K Sarkar
*Assistant Examiner* — Dmitriy Yemelyanov
(74) *Attorney, Agent, or Firm* — Oliff PLC

(57) ABSTRACT

A method for producing mirror-polished wafer, the method produces a plurality of mirror-polished wafers by performing, on plurality of silicon wafers obtained by slicing a silicon ingot, slicing strain removing step of removing strain on a surface caused by slicing, etching step of removing strain caused by the slicing strain removing step, and double-side polishing step of performing mirror polishing on both surfaces of the silicon wafers subjected to etching, each step being performed by batch processing, wherein silicon wafers which are processed in double-side polishing step by batch processing are selected from silicon wafers processed in same batch in the slicing strain removing step and the number of silicon wafers to be selected is made to be equal
(Continued)

to the number of silicon wafers processed in the slicing strain removing step or submultiple thereof. As a result, a method that can produce mirror-polished wafers having high flatness is provided.

3 Claims, 10 Drawing Sheets

(51) Int. Cl.
B24B 37/08 (2012.01)
H01L 21/687 (2006.01)
H01L 21/304 (2006.01)

(52) U.S. Cl.
CPC .. *H01L 21/02013* (2013.01); *H01L 21/02019* (2013.01); *H01L 21/304* (2013.01); *H01L 21/68764* (2013.01); *H01L 21/68771* (2013.01); *H01L 22/12* (2013.01); *H01L 22/26* (2013.01)

(58) Field of Classification Search
USPC .......................................... 438/16
See application file for complete search history.

(56) References Cited

U.S. PATENT DOCUMENTS

2002/0052064 A1* 5/2002 Grabbe ............... B24B 37/0056
438/113
2013/0316521 A1 11/2013 Sasaki et al.
2014/0320867 A1 10/2014 Kanno

FOREIGN PATENT DOCUMENTS

| | | |
|---|---|---|
| JP | 2002-353173 A | 12/2002 |
| JP | 2012-186338 A | 9/2012 |
| JP | 2013-078826 A | 5/2013 |
| TW | 201246347 A | 11/2012 |

OTHER PUBLICATIONS

Sep. 30, 2014 Search Report issued in International Patent Application No. PCT/JP2014/004239.
Dec. 29, 2016 Office Action issued in Taiwanese Patent Application No. 103130145.
Dec. 29, 2016 Search Report issued in Taiwan Patent Application No. 103130145.

* cited by examiner

US 9,748,089 B2

METHOD FOR PRODUCING MIRROR-POLISHED WAFER

TECHNICAL FIELD

The present invention relates to a method for producing a mirror-polished wafer, the method which produces a plurality of mirror-polished wafers.

BACKGROUND ART

In the past, a method for producing a silicon wafer has been generally formed of the following processes. First, a slicing process is performed in which a silicon ingot pulled upwardly by a silicon single crystal pulling apparatus is sliced by a wire saw by using fine SiC powder to obtain silicon wafers in the shape of a thin disk. Then, a chamfering process is performed in which an outer edge portion of each silicon wafer is chamfered to prevent chipping and cracking in the silicon wafer obtained by slicing.

Next, a lapping process adopting a planetary motion method is performed, the lapping process in which a plurality of silicon wafers are sandwiched between cast-iron upper and lower turn tables and machined in order to remove strain on a surface of each silicon wafer, the strain caused by the slicing process, and make the silicon wafers have uniform thickness. At this time, the silicon wafers are lapped while receiving supply of free abrasive grains such as alumina.

Then, a wet etching process is performed in which a mechanically damaged layer generated in the chamfering process and the lapping process is removed. Then, a double-side polishing process in which mirror polishing is performed on both surfaces of the etched silicon wafers by the planetary motion method by using the free abrasive grains, an edge polishing process in which the edge portion is polished to a mirror-smooth state, and a single-side mirror polishing process in which mirror polishing is performed on one side of each wafer are performed. Finally, a cleaning process is performed in which the polishing agent and the foreign substances remaining on the polished wafers are removed to increase the cleanliness, and the production of silicon wafers is completed (refer to Patent Document 1).

With an increase in integration of electronic devices, the flatness standards for silicon wafers become more stringent. Of the processes of the semiconductor wafer production flow, a process having the largest effect on the flatness is a double-side polishing process in which mirror polishing is performed on both surfaces of the silicon wafers.

This double-side polishing apparatus includes upper and lower turn tables, a sun gear provided at the center of the upper face of the lower turn table, an internal gear provided next to the outer edge of the lower turn table, and a plurality of carriers. The carriers are rotatably sandwiched between the upper and lower turn tables, and each carrier has one or more carrier holes provided therein. The silicon wafers are held in these carrier holes and a load is applied downward by a pressing mechanism attached to the upper turn table with the silicon wafers being moved with the carriers relative to polishing pads attached to the upper and lower turn tables, whereby double-side polishing is performed on a plurality of wafers at the same time by batch processing.

CITATION LIST

Patent Literature

Patent Document 1: Japanese Unexamined Patent publication (Kokai) No. 2012-186338

SUMMARY OF INVENTION

Technical Problem

As described above, when a plurality of wafers are polished by being sandwiched between the upper and lower turn tables, wafer thickness variation between the silicon wafers which are polished in the same batch has a large effect on the flatness of the silicon wafers subjected to double-side polishing. In FIG. 10, the relationship between wafer thickness variation between silicon wafers which are polished in the same batch in an existing double-side polishing process and the rate of acquisition of mirror-polished wafers whose SFQRmax is 22 nm or less, the SFQRmax of the surface of the wafer on which the double-side polishing process has been performed, is shown. As shown in FIG. 10, if thickness variation between the silicon wafers which are subjected to double-side polishing in one batch in the double-side polishing process becomes more than 1.25 µm, the flatness of the surface of the silicon wafer on which the double-side polishing process has been performed is significantly degraded.

A process which determines thickness variation between wafers which are subjected to double-side polishing is mainly a slicing strain removing process.

In the slicing strain removing process, a plurality of wafers are lapped by batch processing and thickness variation between the wafers machined in the same batch can be reduced to relatively small variation; however, thickness variation between the wafers machined in different batches becomes greater.

Moreover, in wet etching, a plurality of wafers are etched in one etching tank by batch processing and variation in etching removal can be reduced; however, variation in etching removal between the wafers etched in different batches occurs due to the influence of a change in an etchant with the passage of time, which results in greater wafer thickness variation after the slicing strain removing process. Incidentally, as wet etching, there is a single wafer processing method which etches a plurality of silicon wafers one by one by spraying an etchant on the front and back surfaces of the silicon wafer instead of performing etching processing on the plurality of silicon wafers by batch processing, but this method has low productivity and increases costs.

The present invention has been made in view of the problem, and an object thereof is to provide a method for producing a mirror-polished wafer, the method that can produce mirror-polished wafers having high flatness.

Solution to Problem

To attain the object, the present invention provides a method for producing a mirror-polished wafer, the method that produces a plurality of mirror-polished wafers by performing, on a plurality of silicon wafers obtained by slicing a silicon ingot, a slicing strain removing step for removing strain on a surface caused by the slicing, an etching step for removing strain caused by the slicing strain removing step, and a double-side polishing step of performing mirror polishing on front and back surfaces of the silicon wafers subjected to the etching, each step being performed by batch processing, wherein the silicon wafers which are processed in the double-side polishing step by batch processing are selected from the silicon wafers processed in the same batch in the slicing strain removing step and the number of silicon wafers to be selected is made to be equal to the number of the silicon wafers processed in the slicing strain removing step or a submultiple thereof.

Since thickness variation between the plurality of silicon wafers processed in the same batch in the slicing strain removing step is small, as a result of these silicon wafers being processed in the same batch in the double-side polishing step which is a subsequent step, mirror-polished wafers having high flatness can be produced.

At this time, it is preferable that, by selecting all the silicon wafers processed in one batch or a plurality of batches in the slicing strain removing step as the silicon wafers which are processed in the etching step by batch processing, the number of silicon wafers to be selected is made to be equal to the number of the silicon wafers processed in the slicing strain removing step or a multiple thereof.

By so doing, thickness variation between the silicon wafers subjected to the etching processing in the etching step becomes smaller and, as a result of the silicon wafers with smaller thickness variation being processed in the same batch in the double-side polishing step which is a subsequent step, mirror-polished wafers having higher flatness can be produced reliably.

At this time, in the slicing strain removing step, strain on the surfaces of the silicon wafers can be removed by lapping the silicon wafers with a machining fluid containing free abrasive grains being supplied with the thickness of the silicon wafers being measured by a crystal sizing-type sizing apparatus.

By measuring the thickness of the silicon wafers by the crystal sizing-type sizing apparatus and controlling the lapping completion condition in accordance with the measured thickness, it is possible to reduce an error which is a difference from a target thickness. As a result, it is also possible to reduce thickness variation in the silicon wafers between the batches after lapping. As described above, if thickness variation between the silicon wafers lapped in the slicing strain removing step is small, it is possible to produce mirror-polished wafers having high flatness more reliably and reduce thickness variation between the wafers.

Moreover, it is preferable that, in the slicing strain removing step, strain on the surface of the silicon wafers is removed by performing grinding by making front and back surfaces of the silicon wafers slide while being in contact with grinding sheets with abrasive grains bonded thereto, the abrasive grains having a grain size which allows grinding by which the surface roughness Ra of the silicon wafers becomes 0.3 μm or less to be performed, with water being supplied with the thickness of the silicon wafers being measured by an optical reflection interference-type sizing apparatus.

By performing grinding by using the grinding sheets such that the surface roughness Ra of the silicon wafers becomes 0.3 μm or less, diffused reflection of a laser light emitted from the optical reflection interference-type sizing apparatus does not easily occur at the machined surface of the silicon wafer, which makes it possible to detect an interfering light sufficiently. Therefore, it is possible to grind both surfaces of the silicon wafers while measuring the thickness of the silicon wafers with very high precision. As a result, it is possible to reduce thickness variation in the silicon wafers between the batches after grinding more effectively. As described above, if thickness variation between the silicon wafers ground in the slicing strain removing step is small, it is possible to produce mirror-polished wafers having higher flatness more reliably and further reduce thickness variation between the wafers.

Advantageous Effects of the Invention

With the method for producing a mirror-polished wafer of the present invention, it is possible to produce mirror-polished wafers having high flatness.

DESCRIPTION OF EMBODIMENTS

Hereinafter, an embodiment of the present invention will be described, but the present invention is not limited thereto.

In production of mirror-polished wafers, in a double-side polishing process, if thickness variation between silicon wafers which are subjected to mirror polishing in the same batch is great, the flatness of the mirror-polished wafer whose both surfaces have been subjected to mirror polishing is undesirably degraded.

Thus, the inventors of the present invention have conceived of being able to improve the flatness of the mirror-polished wafers whose both surfaces have been subjected to mirror polishing by processing the silicon wafers, which are processed in the same batch of a slicing strain removing process, in the same batch of a double-side polishing process and completed the present invention.

Hereinafter, a method for producing a mirror-polished wafer of the present invention will be described with reference to the drawings.

Figure 1:
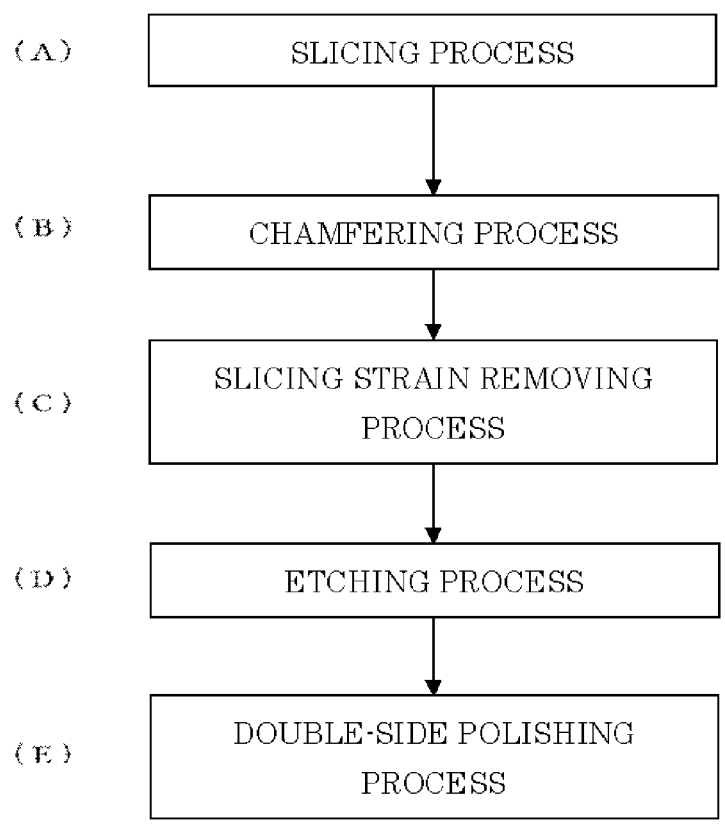
FIG. 1 is a flow diagram of a method for producing a mirror-polished wafer of the present invention.

First, a plurality of silicon wafers obtained by slicing a silicon ingot are prepared (A of FIG. 1). In this process, the silicon ingot are cut into wafers by using a slicing apparatus such as a wire saw. Next, these silicon wafers are chamfered (B of FIG. 1). In this process, an outer edge portion of each silicon wafer is chamfered to prevent chipping and cracking in the silicon wafer obtained by slicing.

Next, a slicing strain removing process is performed (C of FIG. 1). In this slicing strain removing process, the strain on the surface of each silicon wafer, the strain caused by slicing, is removed, the surface is flattened, and the silicon wafers are made to have uniform thickness. At this time, by using a lapping apparatus 1 adopting a planetary motion method, the lapping apparatus 1 shown in FIGS. 2 and 3, slicing strain can be removed by lapping the silicon wafers by batch processing.

Figure 2:
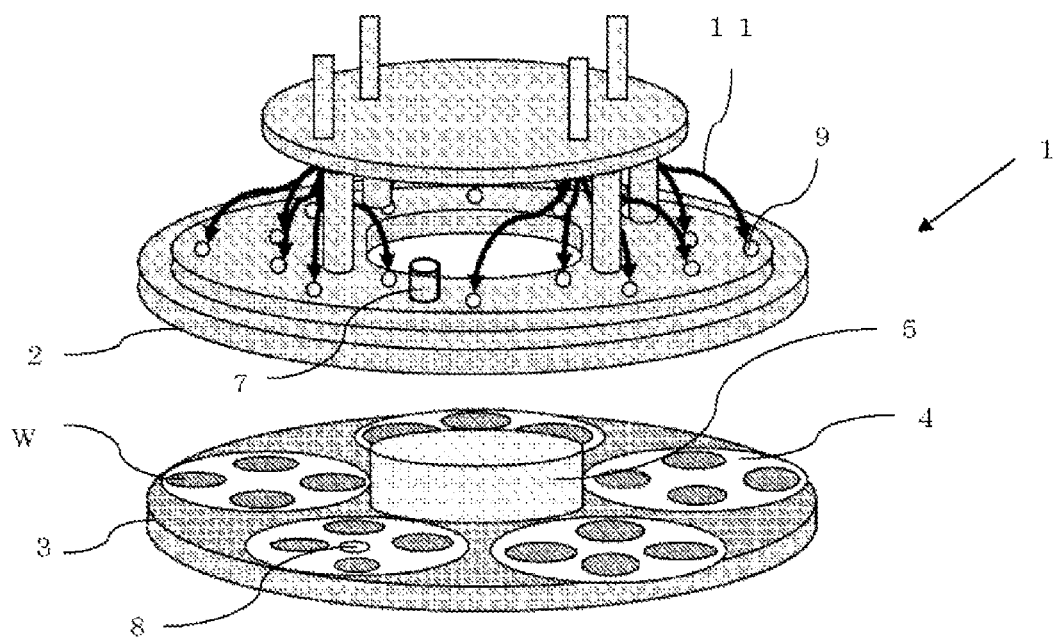
FIG. 2 is a schematic diagram showing an example of a lapping apparatus which is used in a slicing strain removing process of the present invention.
Figure 3:
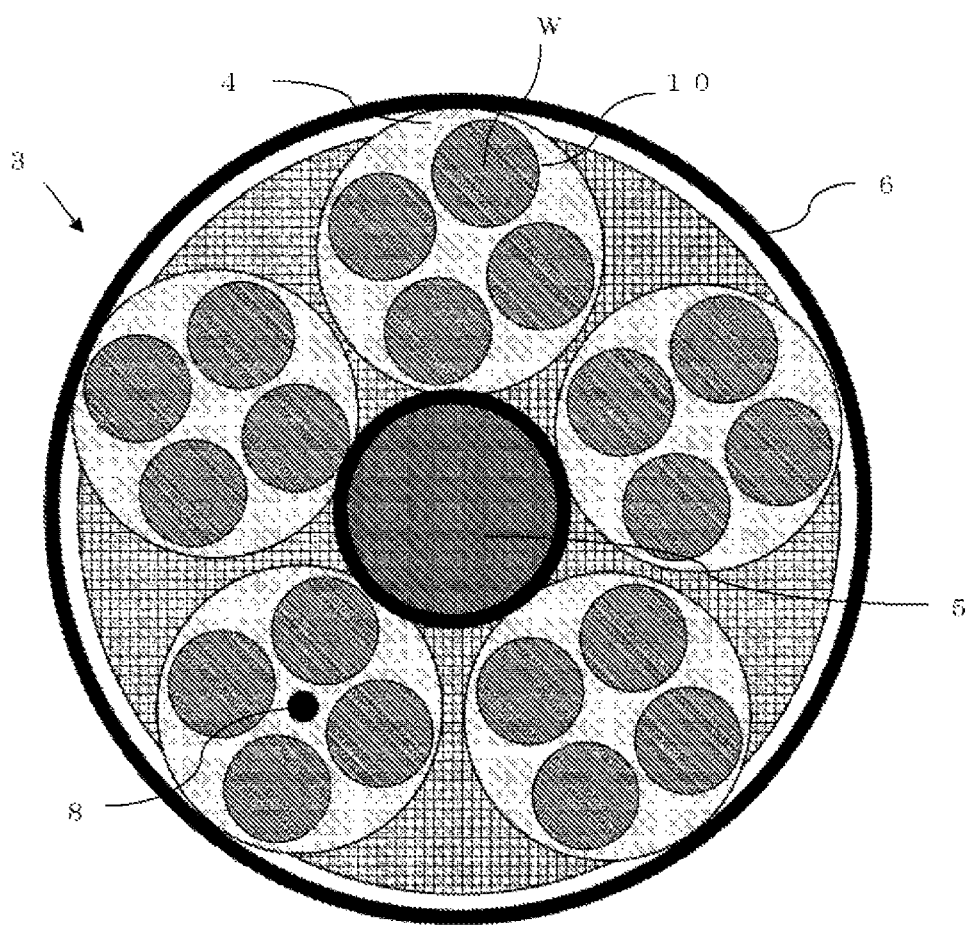
FIG. 3 is a top view showing an example of a lower turn table of the lapping apparatus which is used in the slicing strain removing process of the present invention.

As shown in FIGS. 2 and 3, the lapping apparatus 1 includes an upper turn table 2, a lower turn table 3, carriers 4, a sun gear 5, an internal gear 6, and a crystal-type sizing apparatus 7. As the upper turn table 2 and the lower turn table 3, cast-iron upper turn tables, for example, can be adopted. In the upper turn table 2, machining fluid through holes 9 are provided, and a machining fluid 11 containing free abrasive grains is supplied through these machining fluid through holes 9. Moreover, as the machining fluid 11, what is obtained by suspending free abrasive grains such as alumina in water can be used. On the lower turn table 3, the carriers 4, each having a plurality carrier holes 10 provided therein for holding a plurality of silicon wafers W, are placed. Furthermore, the sun gear 5 is provided in a central part on the lower turn table 3 and the internal gear 6 is provided so as to be located next to the outer edge of the lower turn table 3, and, by making these gears rotate on the axes thereof, the carriers 4 produce planetary motion around the sun gear 5.

Moreover, on the upper turn table 2, the crystal-type sizing apparatus 7 is placed. This crystal-type sizing apparatus 7 uses a piezoelectric effect produced when a crystal piece 8 mounted on the carrier 4 is ground with silicon wafers W and measures the thickness of the silicon wafers by measuring the thickness of the crystal piece by using the fact that the vibration frequency is increased with a reduction in the thickness of the crystal piece. Furthermore, the crystal-type sizing apparatus 7 can control the completion of lapping based on the measurement value.

A plurality of silicon wafers W are sandwiched between the upper and lower turn tables 2 and 3 rotating in relative directions in a state in which the thickness of the silicon wafers W is being measured by the crystal-type sizing apparatus 7 and the carriers 4 are made to produce planetary motion with the machining fluid 11 being supplied, whereby the silicon wafers W are lapped by batch processing. By performing lapping by this lapping apparatus while performing control such that the same target thickness is obtained in each batch, it is possible to reduce not only thickness variation between the silicon wafers W in the batch, but also thickness variation in the silicon wafers W between the batches.

Figure 4:
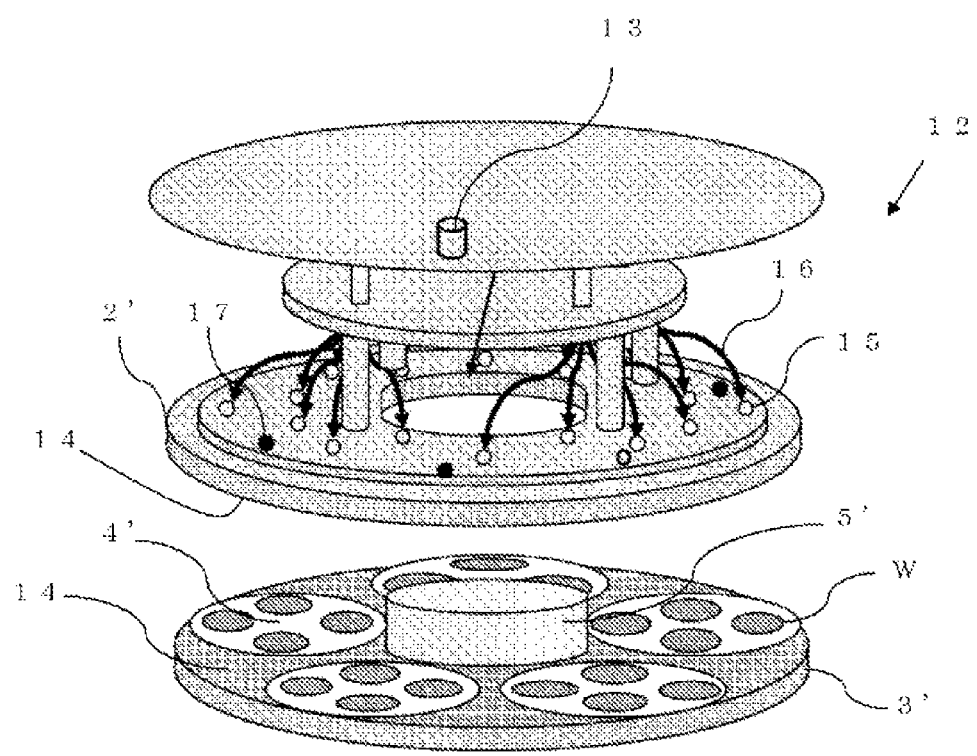
FIG. 4 is a schematic diagram showing an example of a grinding apparatus which is used in the slicing strain removing process of the present invention.
Figure 5:
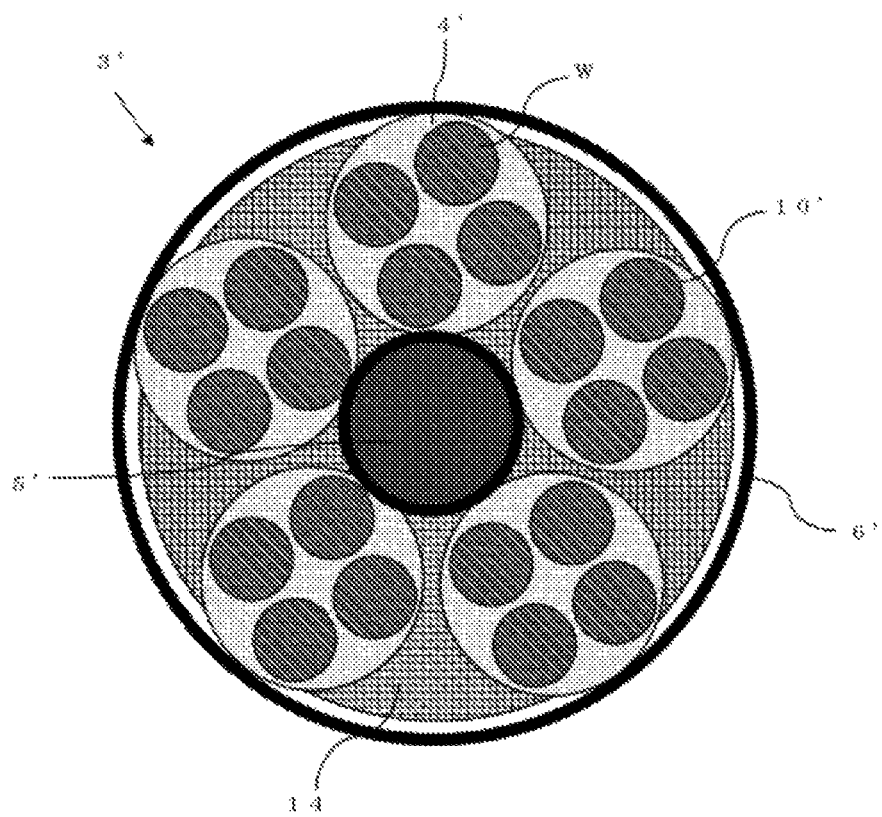
FIG. 5 is a top view showing an example of a lower turn table of the grinding apparatus which is used in the slicing strain removing process of the present invention.

Moreover, in order to reduce thickness variation in the silicon wafers W between the batches, it is preferable to remove slicing strain by grinding the silicon wafers W by batch processing by using a grinding apparatus 12 shown in FIGS. 4 and 5.

As shown in FIGS. 4 and 5, the grinding apparatus 12 includes upper and lower turn tables 2' and 3', carriers 4', a sun gear 5', an internal gear 6', and an optical reflection interference-type sizing apparatus 13.

In the upper turn table 2', water through holes 15 are provided, and water 16 is supplied to the lower turn table 3' through the water through holes 15. On the lower turn table 3', the carriers 4', each having a plurality of carrier holes 10' provided therein for holding the silicon wafers W, are placed. Furthermore, the sun gear 5' is provided in a central part on the lower turn table 3' and the internal gear 6' is provided so as to be located next to the outer edge of the lower turn table 3', and, by making these gears rotate on the axes thereof, the carriers 4' produce planetary motion around the sun gear 5'.

Moreover, above the upper turn table 2', the optical reflection interference-type sizing apparatus 13 is placed. In a method for measuring the thickness of a wafer, the method performed by this optical reflection interference-type sizing apparatus 13, first, the optical reflection interference-type sizing apparatus 13 emits a laser light downward. The emitted laser light is irradiated onto the surface of the silicon wafers being subjected to grinding after passing through laser light through holes 17 provided in the upper turn table 2'. Then, the optical reflection interference-type sizing apparatus 13 detects an interfering light and measures the thickness of the silicon wafers based on the detected interfering light. The optical reflection interference-type sizing apparatus 13 can control the completion of grinding based on this measurement value.

Figure 6:
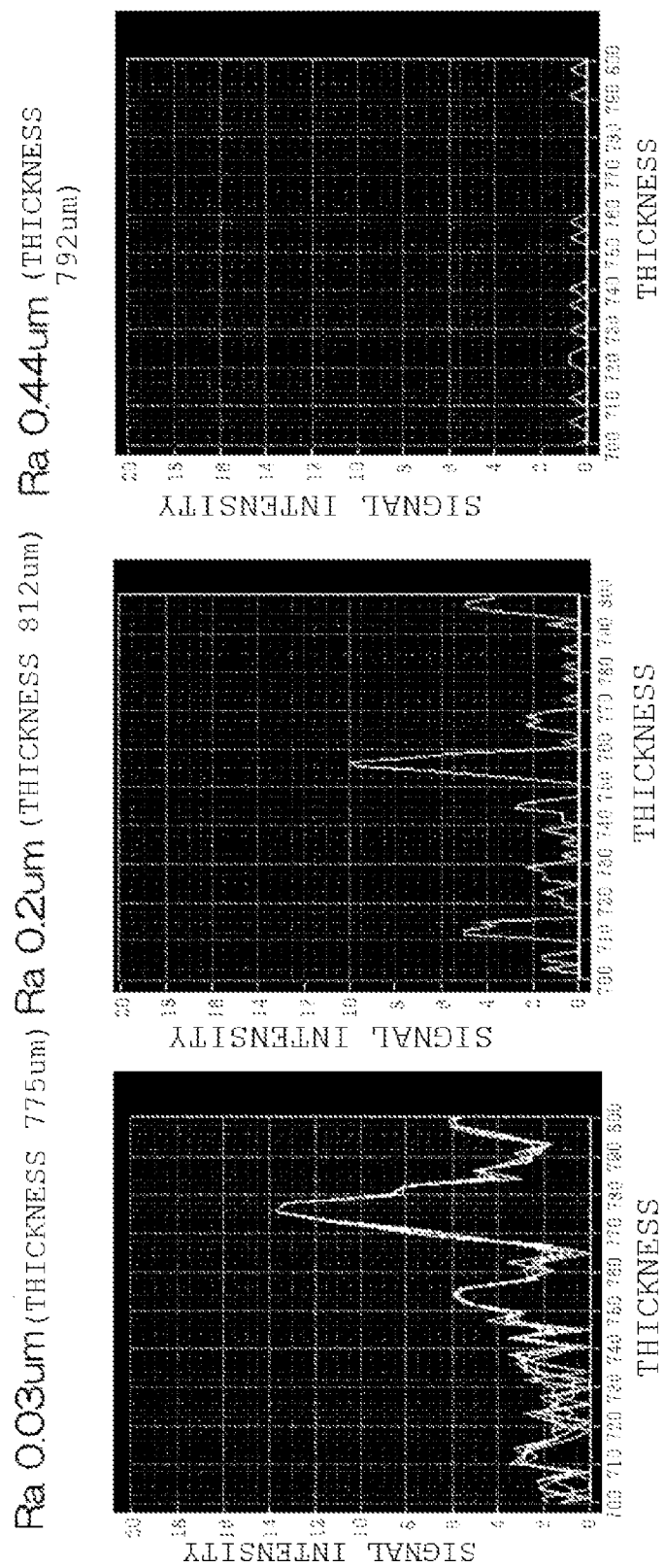
FIG. 6 is a diagram showing the relationship between the intensity of an interfering light and the wafer thickness in different degrees of surface roughness Ra.

To each of the lower face of the upper turn table 2' and the upper face of the lower turn table 3', a grinding sheet 14 with abrasive grains bonded thereto, the grinding sheet 14 for grinding the silicon wafers W, is attached. The abrasive grains are abrasive grains having a grain size which makes it possible to perform grinding by which the surface roughness Ra of the silicon wafers W becomes 0.3 μm or less, and it is preferable to use diamond abrasive grains which are the hardest and resist being worn. If the surface roughness Ra of the silicon wafers W which are being subjected to grinding is 0.3 μm or less, diffused reflection does not occur even when the laser light is irradiated onto a grinding surface by the optical reflection interference-type sizing apparatus 13 and it is possible to detect the interfering light, which makes it possible to measure the thickness with high precision. The results of the study of the relationship between the surface roughness Ra of the silicon wafers and the intensity of the interfering light, the study conducted by the inventors of the present invention, are shown in FIG. 6. When the thickness of the silicon wafers is measured by using the optical reflection interference-type sizing apparatus with the surface roughness Ra of the silicon wafers being varied, the intensity of the interfering light is increased when Ra is 0.03 μm and 0.2 μm and it is possible to perform measurement of higher precision than when Ra is 0.44 μm. Incidentally, the wavelength of the laser light emitted from the optical reflection interference-type sizing apparatus was set at 1300 nm. For measurement of the surface roughness Ra, Laser Microscope VK-X100 series manufactured by KEYENCE CORPORATION was used and the measurement length was set at 4 mm.

By using the grinding apparatus 12 described above, the silicon wafers W are ground by batch processing by sandwiching the plurality of silicon wafers W between the upper and lower turn tables 2' and 3' rotating in relative directions with the thickness of the silicon wafers W being measured by the optical reflection interference-type sizing apparatus 13 and making both surfaces of the silicon wafers W slide while being in contact with the grinding sheets 14 by making the carriers 4' produce planetary motion with the water 16 being supplied. By performing grinding by using this grinding apparatus 12 while performing control such that the same target thickness is obtained in each batch, not only thickness variation between the silicon wafers W in the batch, but also thickness variation between the silicon wafers W in different batches can be further reduced.

Figure 7:
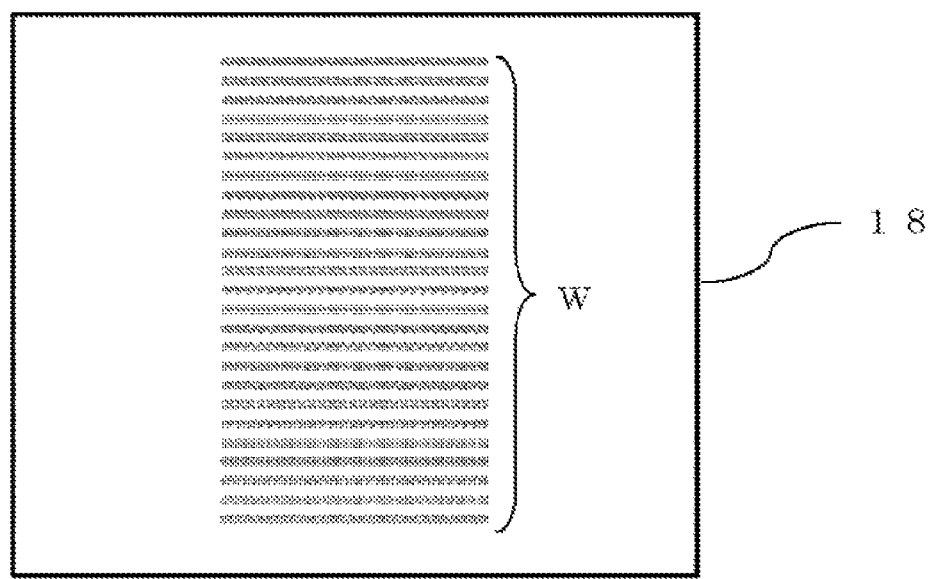
FIG. 7 is a top view showing an example of an etching apparatus which is used in an etching process of the present invention.

After the slicing strain removing process is finished, an etching process for removing the strain caused in the slicing strain removing process is performed (D of FIG. 1). In the etching process, wet etching is performed on the plurality of wafers by batch processing. For example, as shown in FIG. 7, the plurality of silicon wafers W are put into an etching apparatus 18 filled with an etchant formed of caustic soda and the like, and etching processing is performed on the plurality of silicon wafers W at the same time.

In this etching process, it is preferable to select, as silicon wafers to be etched by batch processing, all the silicon wafers processed in one batch or a plurality of batches in the slicing strain removing process and make the number of silicon wafers to be selected equal to the number of the silicon wafers processed in the slicing strain removing process or a multiple thereof. For example, if 100 silicon wafers were processed in five batches with the number of silicon wafers to be processed in one batch being set at 20 in the slicing strain removing process, 20 silicon wafers are selected from a wafer group processed in an arbitrary one batch of these five batches, and etching processing can be performed on these selected silicon wafers by batch processing. Alternatively, all the silicon wafers (in this case, 40 to 100 silicon wafers) processed in arbitrary batches (in this case, a plurality of batches of the first to fifth batches) of the five batches in the slicing strain removing process in the example described above are selected, and etching processing can be performed on the selected silicon wafers by batch processing.

By so doing, it is possible to reduce thickness variation between the wafers processed in one batch in the etching process.

After the etching process is finished, a double-side polishing process is performed in which mirror polishing is performed on both surfaces of the plurality of silicon wafers by batch processing (E of FIG. 1). In a method for producing a mirror-polished wafer of the present invention, silicon wafers whose both surfaces are subjected to mirror polishing by batch processing in this double-side polishing process are selected from the silicon wafers processed in the same batch in the slicing strain removing process. Wafer thickness variation between these strain is very small. Therefore, it is possible to reduce thickness variation between the plurality of wafers which are polished in the double-side polishing process. At this time, the number of silicon wafers to be selected may be equal to the number of silicon wafers processed in the slicing strain removing process or may be set at a submultiple of the number of silicon wafers processed in the slicing strain removing process and the number of batches may be divided into multiple times.

Figure 8:
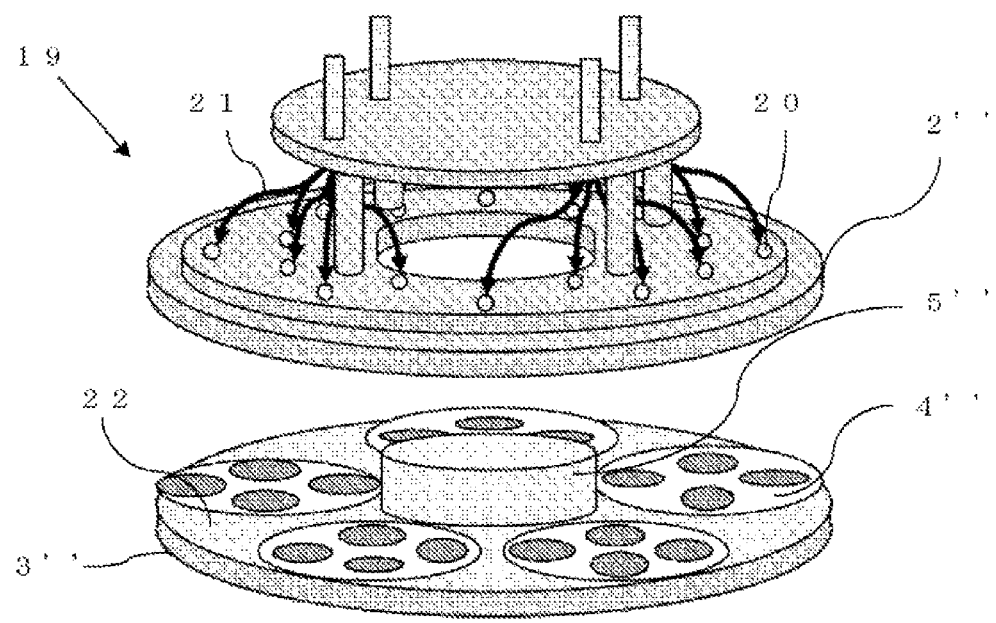
FIG. 8 is a schematic diagram showing an example of a double-side polishing apparatus which is used in a double-side polishing process of the present invention.
Figure 9:
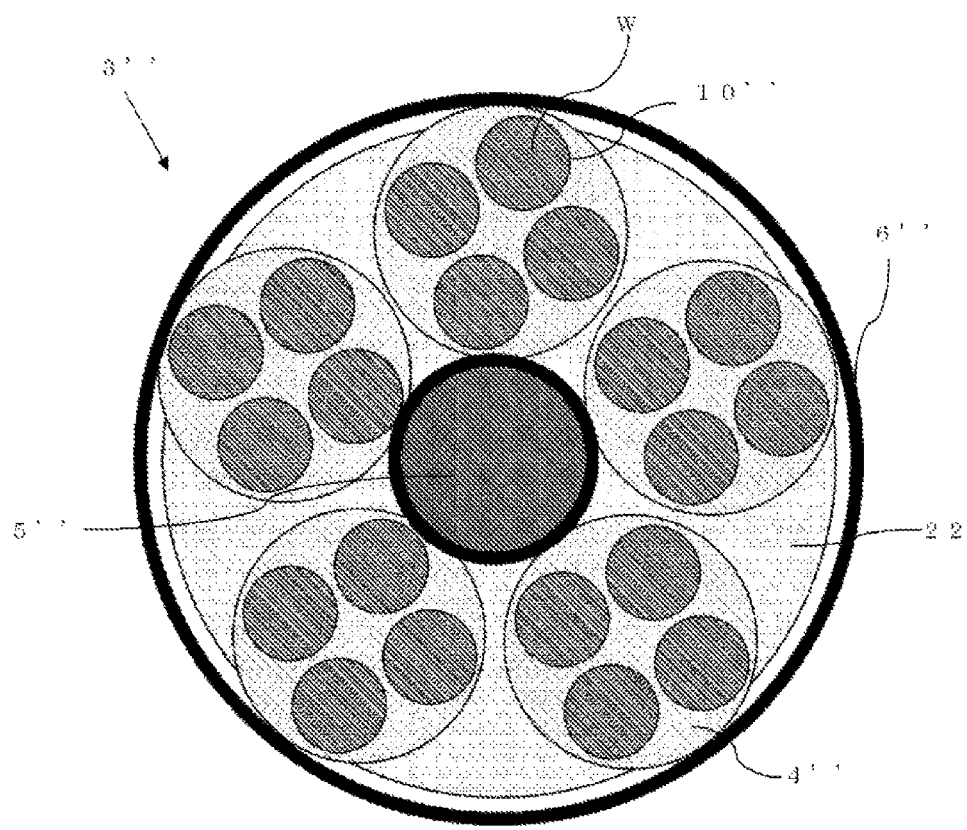
FIG. 9 is a top view showing an example of a lower turn table of the double-side polishing apparatus which is used in the double-side polishing process of the present invention.
Figure 10:
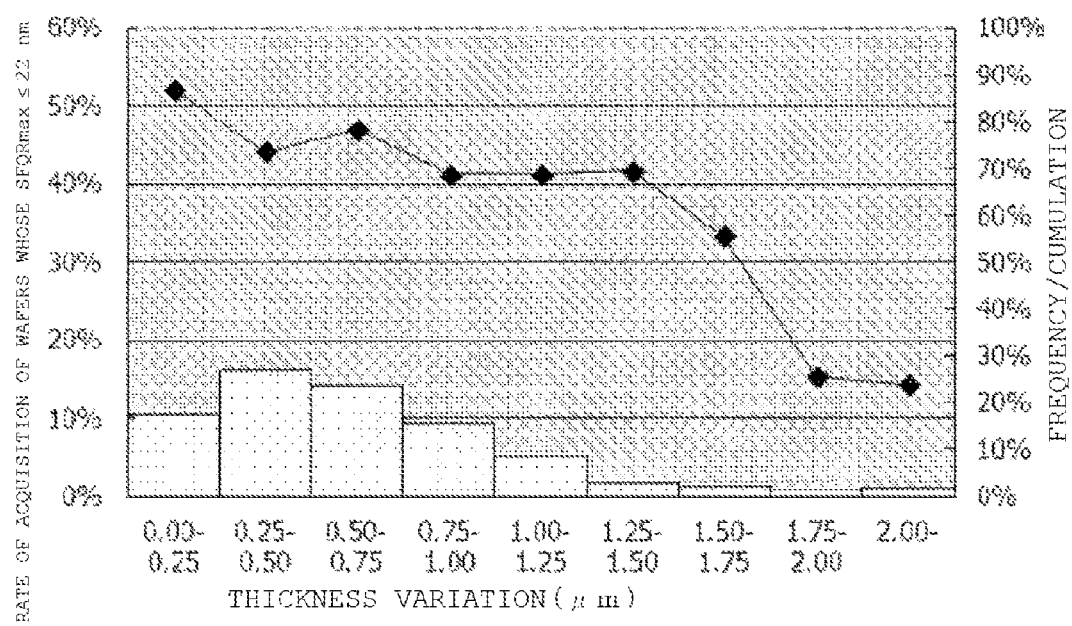
FIG. 10 shows the relationship between thickness variation between wafers and the rate of acquisition of mirror-polished wafers whose SFQRmax is 22 nm or less.

To perform mirror polishing on both surfaces of the selected silicon wafers by batch processing in the manner described above, a double-side polishing apparatus 19 adopting a planetary motion method, the double-side polishing apparatus 19 shown in FIGS. 8 and 9, can be used.

First, carriers 4" are brought into engagement with a sun gear 5" and an internal gear 6" of the double-side polishing apparatus 19, and silicon wafers W are set into carrier holes 10" of the carriers 4". Then, both surfaces of the silicon wafers W are held in such a way as to be sandwiched between an upper turn table 2" and a lower turn table 3", a polishing agent 21 is supplied through polishing agent through holes 20, the carriers 4" are made to produce planetary motion by the sun gear 5" and the internal gear 6", and, at the same time, the upper turn table 2" and the lower turn table 3" are rotated in relative directions, whereby both surfaces of the silicon wafers W are slid while being in contact with polishing pads 22. In this manner, mirror-polished wafers are produced.

By producing mirror-polished wafers in the manner described above, since it is possible to machine the silicon wafers with small thickness variation therebetween, the silicon wafers processed in the same batch in the slicing strain removing process, in the same batch in the double-side polishing process, it is possible to improve the flatness of the mirror-polished wafers subjected to double-side polishing.

EXAMPLES

Hereinafter, the present invention will be described more specifically by using Examples of the present invention and Comparative Example, but the present invention is not limited to these Examples.

Example 1

A silicon single crystal ingot having a diameter of 300 mm was sliced. 100 silicon wafers obtained by slicing were chamfered. Then, mirror-polished wafers were produced in accordance with a flow diagram of the method for producing a mirror-polished wafer of the present invention shown in FIG. 1. First, in the slicing strain removing process, by using a 4-way lapping machine adopting a planetary motion method, the 4-way lapping machine with cast-iron upper and lower turn tables that can process 20 silicon wafers in one batch, 20 silicon wafers were lapped in one batch, and the 100 silicon wafers were lapped by performing lapping in five consecutive batches. Alumina abrasive grains having an average grain size of 6 µm were suspended in water and used as a machining fluid, a crystal-type sizing apparatus was used, and a finished target thickness was set. After lapping was finished, the thickness of the silicon wafers was measured by using a capacitive sensor. As indicated in Table 1, with respect to the target value, the thickness of the silicon wafers observed when lapping was finished averaged −0.7 µm in the first batch, +1.1 µm in the second batch, +0.5 µm in the third batch, +1.6 µm in the fourth batch, and −3.0 µm in the fifth batch. Thickness variation in a batch (a difference between the maximum value of the thickness of the silicon wafers in a batch and the minimum value of the thickness of the silicon wafers in the batch) was 0.1 µm in the first and second batches and was 0.2 µm in the other three batches.

Next, the etching process was performed. In accordance with the production method of the present invention, the 100 wafers subjected to lapping in the slicing strain removing process were etched in five consecutive batches, 20 wafers in one batch, such that the silicon wafers lapped in the same lapping batch were subjected to etching processing in the same etching batch. As an etchant, caustic soda at a 50 percent concentration heated to 80° C. was used. As a result, as indicated in Table 1, thickness variation after etching was 0.1 µm in the first batch and 0.2 µm in the second to fifth batches.

Next, the double-side polishing process was performed. Mirror polishing was performed on both surfaces of the 100 silicon wafers by performing polishing in five consecutive batches by using a 4-way double-side polishing machine adopting a planetary motion method, the 4-way double-side polishing machine capable of polishing 20 wafers in one batch, such that the wafers in the same lapping batch (that is, the same etching batch) were machined in the same double-side polishing batch. As the polishing agent, colloidal silica having an average grain size of 35 to 70 nm, the colloidal silica to which caustic potash was added, was diluted with pure water such that pH became 10.5. As the polishing pad, a commercially available nonwoven polishing pad was used. After the double-side polishing process was finished, the mirror-polished wafers were cleaned. Then, the flatness of the wafers was measured by using WaferSight manufactured by KLA-Tencor Corporation and SFQRmax was evaluated. As a result, as indicated in Table 1, the rate of acquisition of wafers whose SFQRmax was 22 nm or less was 52%.

It has been confirmed that, in Example 1, the rate of acquisition of mirror-polished wafers having high flatness is higher than the rate in Comparative Example, which will be described later, and mirror-polished wafers having high flatness can be produced more reliably.

Example 2

A silicon single crystal ingot having a diameter of 300 mm was sliced. The silicon wafers obtained by slicing were chamfered. Then, mirror-polished wafers were produced in accordance with the flow diagram of the method for producing a mirror-polished wafer shown in FIG. 1. First, in the slicing strain removing process, under the same conditions as those in Example 1, 20 silicon wafers were lapped in one batch. After lapping was finished, the thickness of the silicon wafers was measured by using the capacitive sensor. As indicated in Table 1, the thickness of the silicon wafers observed after lapping was finished averaged +1.4 µm with respect to the target value. Thickness variation between the wafers in a batch was 0.2 µm.

Next, the etching process was performed. Under the same conditions as those of Example 1, 20 silicon wafers were etched in one batch. After etching was finished, the thickness of the silicon wafers was measured by using the capacitive sensor. The results indicated that thickness variation between the wafers was 0.2 µm.

Next, the double-side polishing process was performed. Double-side polishing was performed under the same conditions as those of Example 1 except that a 4-way double-side polishing machine adopting a planetary motion method, the 4-way double-side polishing machine capable of polishing five wafers in one batch, was used and mirror polishing was performed on both surfaces of the 20 silicon wafers by performing polishing in four consecutive batches. As a result, as indicated in Table 1, the rate of acquisition of wafers whose SFQRmax was 22 nm or less was 50%.

It has been confirmed that, also in Example 2, the rate of acquisition of mirror-polished wafers having high flatness is higher than the rate in Comparative Example, which will be described later, and mirror-polished wafers having high flatness can be produced more reliably.

Example 3

A silicon single crystal ingot having a diameter of 300 mm was sliced and 100 silicon wafers were prepared. After chamfering, the grinding apparatus shown in FIG. 4 was prepared, the grinding apparatus provided with grinding sheets containing diamond abrasive grains with an average grain size of 4 µm and being attached, with a double-faced tape, to upper and lower turn tables of a 4-way lapping machine adopting a planetary motion method, the 4-way lapping machine provided with the cast-iron upper and lower turn tables and capable of processing 20 wafers in one batch. Next, a finished target thickness was set by a wavelength-variable optical reflection interference-type sizing apparatus, and grinding was performed in five consecutive batches, 20 wafers in one batch, with water being supplied to the grinding sheets. At this time, the wavelength of a laser light emitted from the optical reflection interference-type sizing apparatus was set at 1300 nm. When the surface roughness of the silicon wafers after grinding was measured by using Laser Microscope VK-X100 series manufactured by KEYENCE CORPORATION at a measurement length of 4 mm, Ra was 0.2 µm. The thickness of the silicon wafers after grinding was measured by using the capacitive sensor. With respect to the target value, the thickness observed after grinding was finished averaged 0 µm in the first batch, +0.1 µm in the second batch, +0.4 µm in the third batch, −0.4 µm in the fourth batch, and −0.1 µm in the fifth batch. As indicated in Table 1, thickness variation between the wafers in a batch was 0.2 µm in the second, fourth, and fifth batches and 0.1 µm in the first and third batches.

Next, the etching process was performed. Under the same conditions as those of Example 1, by using an etching apparatus etching 20 wafers in one batch, the silicon wafers ground in the same batch were etched in five consecutive batches, 20 wafers in one batch, such that the silicon wafers ground in the same batch were subjected to etching processing in the same etching batch. The results indicated that thickness variation was 0.2 µm in all the batches.

Next, the double-side polishing process was performed. Under the same conditions as those of Example 1, by using a 4-way double-side polishing machine adopting a planetary motion method, the 4-way double-side polishing machine capable of polishing 20 wafers in one batch, mirror polishing was performed on both surfaces of the 100 silicon wafers by performing polishing in five consecutive batches such that the wafers ground in the same grinding batch were polished in the same double-side polishing batch. After the mirror-polished wafers thus produced were cleaned, the flatness of the wafers was measured by using WaferSight manufactured by KLA-Tencor Corporation and SFQRmax was evaluated. The results indicated that the rate of acquisition of wafers whose SFQRmax was 22 nm or less was 53%.

It has been confirmed that, in Example 3, more mirror-polished wafers having high flatness can be produced than in Examples 1 and 2.

Comparative Example

A silicon single crystal ingot having a diameter of 300 mm was sliced. After chamfering, 100 silicon wafers were lapped in five batches, 20 wafers in one batch, under the same conditions as those of Example 1, and, after lapping was finished, the thickness of the silicon wafers was measured by using the capacitive sensor. With respect to the target value, the thickness averaged +2.1 µm in the first batch, −1.0 µm in the second batch, 0 µm in the third batch, +1.2 µm in the fourth batch, and −0.8 µm in the fifth batch. Thickness variation in a batch was 0.2 µm in the first and fifth batches and was 0.1 µm in the other three batches.

Next, the 100 silicon wafers subjected to lapping in the manner were etched in four consecutive batches in the same order as lapping by using an etching apparatus etching 25 wafers in one batch. That is, etching processing was performed in such a way that a wafer group formed of the silicon wafers lapped in different lapping batches was etched in the same etching batch. As an etchant, caustic soda at a 50 percent concentration heated to 80° C. was used. After etching was finished, the thickness of the silicon wafers was measured by using the capacitive sensor. As a result, as indicated in Table 1, thickness variation between the wafers in a batch was 3.3 μm in the first batch, 1.0 μm in the second batch, 1.5 μm in the third batch, and 2.2 μm in the fourth batch.

Next, mirror polishing was performed on the 100 silicon wafers etched in the manner in 20 consecutive batches by using a 4-way double-side polishing machine adopting a planetary motion method, the 4-way double-side polishing machine capable of processing five wafers in one batch in the order in which lapping was performed. The other conditions were the same as those of Example 1. After double-side polishing was performed on all the batches, the mirror-polished wafers were cleaned. After cleaning, the flatness of the wafers was measured by using WaferSight manufactured by KLA-Tencor Corporation and SFQRmax was evaluated. The results indicated that the rate of acquisition of mirror-polished wafers whose SFQRmax was 22 nm or less was 24%. As compared to Examples 1 to 3 described above, the percentage of mirror-polished wafers having high flatness in the produced mirror-polished wafers became less than 50%.

In Table 1, the summary of the results of Examples and Comparative Example is listed.

TABLE 1

| | | Example 1 | | Example 2 | | Example 3 | | Comparative Example | |
|---|---|---|---|---|---|---|---|---|---|
| | | Average thickness | Thickness variation between wafers in batch | Average thickness | Thickness variation between wafers in batch | Average thickness | Thickness variation between wafers in batch | Average thickness | Thickness variation between wafers in batch |
| After slicing strain removing process | 1st batch | −0.7 | 0.1 | +1.4 | 0.2 | 0 | 0.1 | +2.1 | 0.2 |
| | 2nd batch | +1.1 | 0.1 | — | — | +0.1 | 0.2 | −1.0 | 0.1 |
| | 3rd batch | +0.5 | 0.2 | — | — | +0.4 | 0.1 | 0 | 0.1 |
| | 4th batch | +1.6 | 0.2 | — | — | −0.4 | 0.2 | +1.2 | 0.1 |
| | 5th batch | −3.0 | 0.2 | — | — | −0.1 | 0.2 | −0.8 | 0.2 |
| After etching process | 1st batch | — | 0.1 | — | 0.2 | — | 0.2 | — | 3.3 |
| | 2nd batch | — | 0.2 | — | — | — | 0.2 | — | 1.0 |
| | 3rd batch | — | 0.2 | — | — | — | 0.2 | — | 1.5 |
| | 4th batch | — | 0.2 | — | — | — | 0.2 | — | 2.2 |
| | 5th batch | — | 0.2 | — | — | — | 0.2 | — | — |
| The rate of acquisition of mirror-polished wafers whose SFQRmax ≤22 nm after double-side polishing process | | 52% | | 4 50% | | 53% | | 24% | |

It is to be understood that the present invention is not limited in any way by the embodiment thereof described above. The embodiment is merely an example, and anything that has substantially the same structure as the technical idea recited in the claims of the present invention and that offers similar workings and benefits falls within the technical scope of the present invention.

The invention claimed is:

1. A method for producing a mirror-polished wafer, the method comprising producing a plurality of mirror-polished wafers by performing, on a plurality of silicon wafers obtained by slicing a silicon ingot:

removing a slicing strain on a surface caused by the slicing;

etching in order to remove strain caused by removing the slicing strain; and performing double-side mirror polishing on front and back surfaces of the silicon wafers subjected to the etching, each of the removing the slicing strain, etching and performing double-side mirror polishing steps being performed by batch processing, wherein the silicon wafers which are processed in the performing the double-side mirror polishing step by batch processing are selected from the silicon wafers processed in a same batch in the removing the slicing strain step and a number of silicon wafers to be selected is made to be equal to a number of the silicon wafers processed in the removing the slicing strain step or a submultiple thereof, and by selecting all the silicon wafers processed in one batch or a plurality of batches in the removing the slicing strain step as the silicon wafers which are processed in the etching step by batch processing, a number of silicon wafers to be selected is made to be equal to a number of the silicon wafers processed in the removing the slicing strain step or a multiple thereof.

2. The method for producing a mirror-polished wafer according to claim 1, wherein in the removing the slicing strain step, strain on the surface of the silicon wafers is removed by lapping the silicon wafers with a machining fluid containing free abrasive grains being supplied with a thickness of the silicon wafers being measured by a crystal sizing-type sizing apparatus.

3. The method for producing a mirror-polished wafer according to claim 1, wherein in the removing the slicing strain step, strain on the surface of the silicon wafers is removed by performing grinding by making front and back surfaces of the silicon wafers slide while being in contact with grinding sheets with abrasive grains bonded thereto, the abrasive grains having a grain size which allows grinding by which surface roughness Ra of the silicon wafers becomes 0.3 µm or less to be performed, with water being supplied with a thickness of the silicon wafers being measured by an optical reflection interference-type sizing apparatus.

* * * * *